(12) United States Patent
Kamiya et al.

(10) Patent No.: US 10,847,754 B2
(45) Date of Patent: *Nov. 24, 2020

(54) SEMICONDUCTOR DEVICE HAVING A DENSITY OF THE FIRST INORGANIC LAYER IN THE FIRST REGION IS HIGHER THAN IN THE SECOND REGION

(71) Applicant: Japan Display Inc., Minato-ku (JP)

(72) Inventors: Akinori Kamiya, Minato-ku (JP); Daisuke Kato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/702,138

(22) Filed: Dec. 3, 2019

(65) Prior Publication Data

US 2020/0106051 A1    Apr. 2, 2020

Related U.S. Application Data

(63) Continuation of application No. 16/255,233, filed on Jan. 23, 2019, now Pat. No. 10,516,138, which is a
(Continued)

(30) Foreign Application Priority Data

Feb. 19, 2016    (JP) .................................. 2016-030160

(51) Int. Cl.
*H01L 27/28* (2006.01)
*H01L 51/52* (2006.01)
(Continued)

(52) U.S. Cl.
CPC ...... *H01L 51/5256* (2013.01); *H01L 51/5253* (2013.01); *H01L 51/5275* (2013.01); *H01L 51/56* (2013.01); *H01L 27/3244* (2013.01)

(58) Field of Classification Search
CPC ... H01L 27/288; H01L 27/32; H01L 27/3244; H01L 2227/32; H01L 2251/50
See application file for complete search history.

(56) References Cited

U.S. PATENT DOCUMENTS 10,243,168 B2    3/2019  Kamiya
10,516,138 B2 *  12/2019 Kamiya ............. H01L 51/5256
(Continued)

FOREIGN PATENT DOCUMENTS

JP    2004-79291       3/2004
JP    2007-220646 A    8/2007
(Continued)

OTHER PUBLICATIONS

Japanese Office Action dated Jan. 7, 2020 in Patent Application No. 2016-030160 (with unedited computer generated English translation), 7 pages.
(Continued)

*Primary Examiner* — Hoai V Pham
(74) *Attorney, Agent, or Firm* — Oblon, McClelland, Maier & Neustadt, L.L.P.

(57) ABSTRACT

A display device includes a light-emitting element layer that emits light with a luminance controlled for each of a plurality of unit pixels constituting an image, and a sealing layer provided on the light-emitting element layer and including a plurality of layers. The plurality of layers of the sealing layer includes at least an inorganic layer provided on the light-emitting element layer, an organic layer provided on the inorganic layer, and an inorganic layer that is an uppermost layer. A density of the inorganic layer that is the uppermost layer in a thickness direction changes in the thickness direction.

14 Claims, 7 Drawing Sheets

Related U.S. Application Data continuation of application No. 15/926,775, filed on Mar. 20, 2018, now Pat. No. 10,243,168, which is a continuation of application No. 15/363,314, filed on Nov. 29, 2016, now Pat. No. 9,966,570.

(51) Int. Cl.
*H01L 51/56* (2006.01)
*H01L 27/32* (2006.01)

(56) References Cited

U.S. PATENT DOCUMENTS

| | | | |
|---|---|---|---|
| 2017/0012225 A1 | 1/2017 | Heo | |
| 2017/0062537 A1 | 3/2017 | Kim | |

FOREIGN PATENT DOCUMENTS

| | | |
|---|---|---|
| JP | 2009-76232 A | 4/2009 |
| JP | 2009-95989 A | 5/2009 |
| JP | 2009-274251 A | 11/2009 |
| JP | 2013-504863 A | 2/2013 |
| JP | 2013-56513 A | 3/2013 |
| JP | 2013-56514 A | 3/2013 |
| KR | 10-2016-0008608 | 1/2016 |
| WO | WO 20111029787 A1 | 3/2011 |

OTHER PUBLICATIONS

Office Action dated Feb. 20, 2018 in Korean Application No. 10-2016-0156356 with English Translation.

Office Action dated Aug. 20, 2018 in Korean Patent Application No. 10-2016-0156356 with English translation.

Japanese Office Action dated Mar. 24, 2020 in Patent Application No. 2016-030160 (with English translation), 7 pages.

Combined Chinese Office Action and Search Report dated Apr. 2, 2020 in Chinese Patent Application No. 201611070061.0 (with unedited computer generated English translation and English translation of Category of Cited Documents), 16 pages.

\* cited by examiner

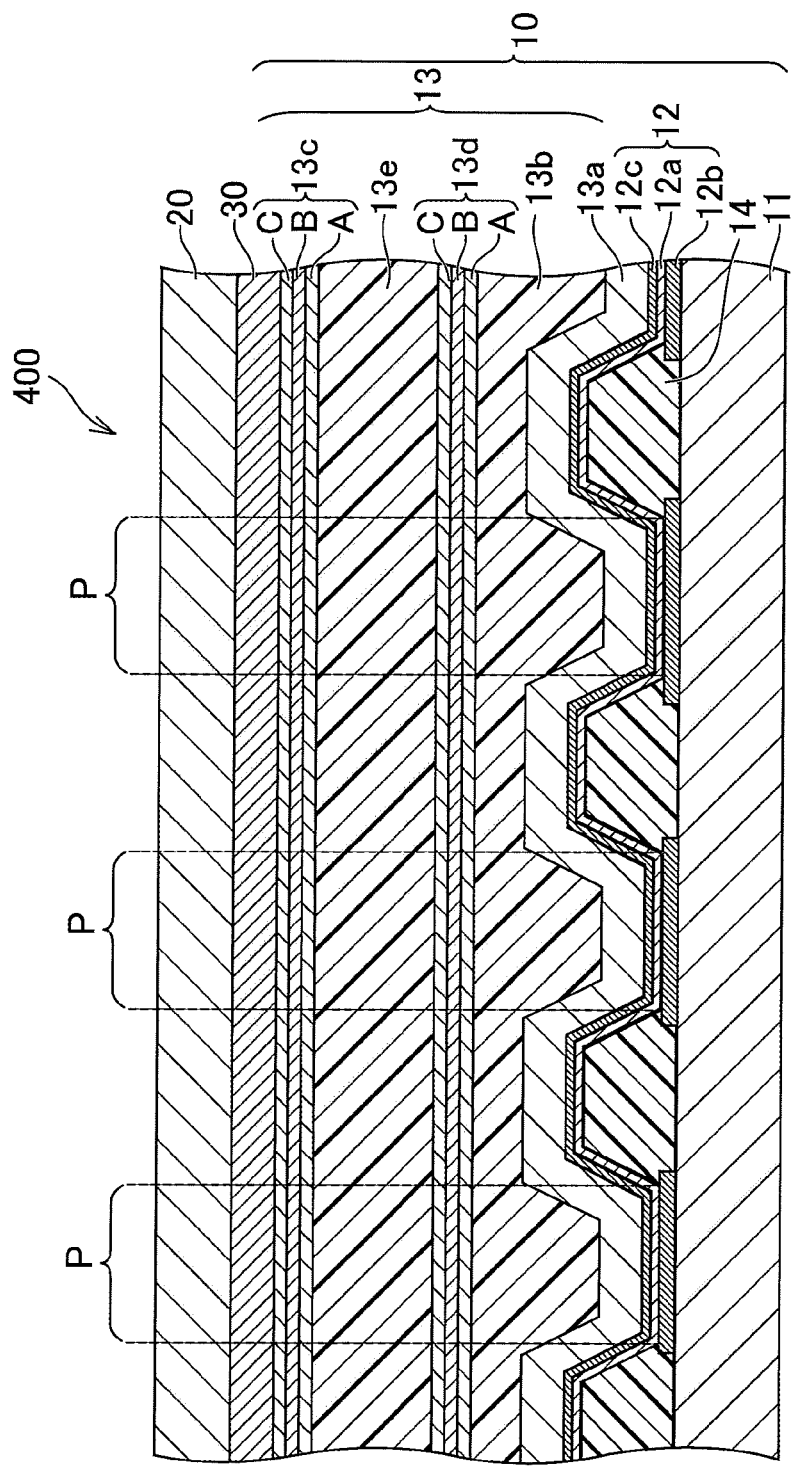

SEMICONDUCTOR DEVICE HAVING A DENSITY OF THE FIRST INORGANIC LAYER IN THE FIRST REGION IS HIGHER THAN IN THE SECOND REGION

CROSS-REFERENCE TO RELATED APPLICATION

The present application is a continuation application of U.S. application Ser. No. 16/255,233 filed Jan. 23, 2019, which is a continuation application of U.S. application Ser. No. 15/926,775, filed Mar. 20, 2018, which is a continuation of U.S. application Ser. No. 15/363,314, filed on Nov. 29, 2016 (now patented), which claims priority from Japanese application JP2016-030160 filed on Feb. 19, 2016, the content of each of which is hereby incorporated by reference into this application.

BACKGROUND

1. Field

The present disclosure relates to a display device and a method for manufacturing a display device.

2. Description of the Related Art

A display device including a light-emitting element layer that emits light with a luminance controlled for each of a plurality of unit pixels constituting an image, and a sealing layer covering the light-emitting element layer has been conventionally known. The sealing layer is provided for preventing moisture from entering the inside of the device from the outside and reaching the light-emitting element layer. As the sealing layer, one having three-layer structure including an inorganic layer, an organic layer (resin layer) provided on the inorganic layer, and an inorganic layer provided on the organic layer is known as disclosed in, for example, JP 2004-079291 A.

In recent years, the display device is required to be flexible, and ensuring the resistance of the display device to bending becomes a problem. When the sealing layer including the inorganic layer made of silicon nitride or the like is used as disclosed in JP 2004-079291 A, the inorganic layer may be broken at the time of bending the display device. Therefore, it is conceivable to reduce the thickness of the inorganic layer for ensuring the resistance to bending. However, when the thickness of the inorganic layer included in the sealing layer is reduced, the sealing layer may fail to play its essential role of preventing the entry of moisture into the inside of the device.

SUMMARY

It is an object of the disclosure to provide a display device that prevents the entry of moisture into the inside of the device while ensuring resistance to bending, and a method for manufacturing the display device.

A display device according to an aspect of the disclosure includes: a light-emitting element layer; and a sealing layer on the light-emitting element layer and including a plurality of layers, wherein the plurality of layers includes at least a first inorganic layer on the light-emitting element layer, an organic layer on the first inorganic layer, and a second inorganic layer on the organic layer, and a density of the second inorganic layer in a thickness direction changes in the thickness direction.

A method for manufacturing a display device according to another aspect of the disclosure includes the steps of: preparing a substrate; forming a light-emitting element layer on the substrate; and forming, on the light-emitting element layer, a sealing layer including a plurality of layers, wherein the step of forming the sealing layer including the plurality of layers includes the steps of forming a first inorganic layer on the light-emitting element layer, forming an organic layer on the first inorganic layer, and forming, at an uppermost layer of the plurality of layers, a second inorganic layer whose density in a thickness direction changes in the thickness direction.

BRIEF DESCRIPTION OF THE DRAWINGS

FIG. 7 is a schematic cross-sectional view schematically showing a cross-section of a display device according to a fourth embodiment.

DETAILED DESCRIPTION

Hereinafter, embodiments of the disclosure will be described with reference to the drawings.

In the embodiments of the disclosure, when the term "on" is simply used to express the form in which one structure is disposed "on" another structure, the term includes, unless otherwise noted, both the case where one structure is disposed directly on another structure so as to be in contact therewith and the case where one structure is disposed above another structure with still another structure therebetween.

Figure 1:
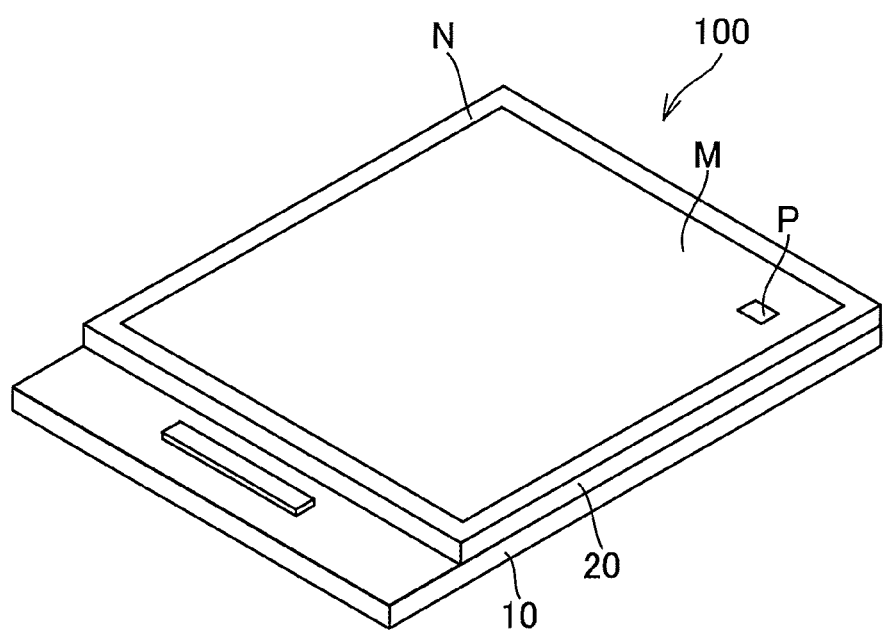
FIG. 1 is an external appearance perspective view of a display device according to each of first to fourth embodiments.
Figure 2:
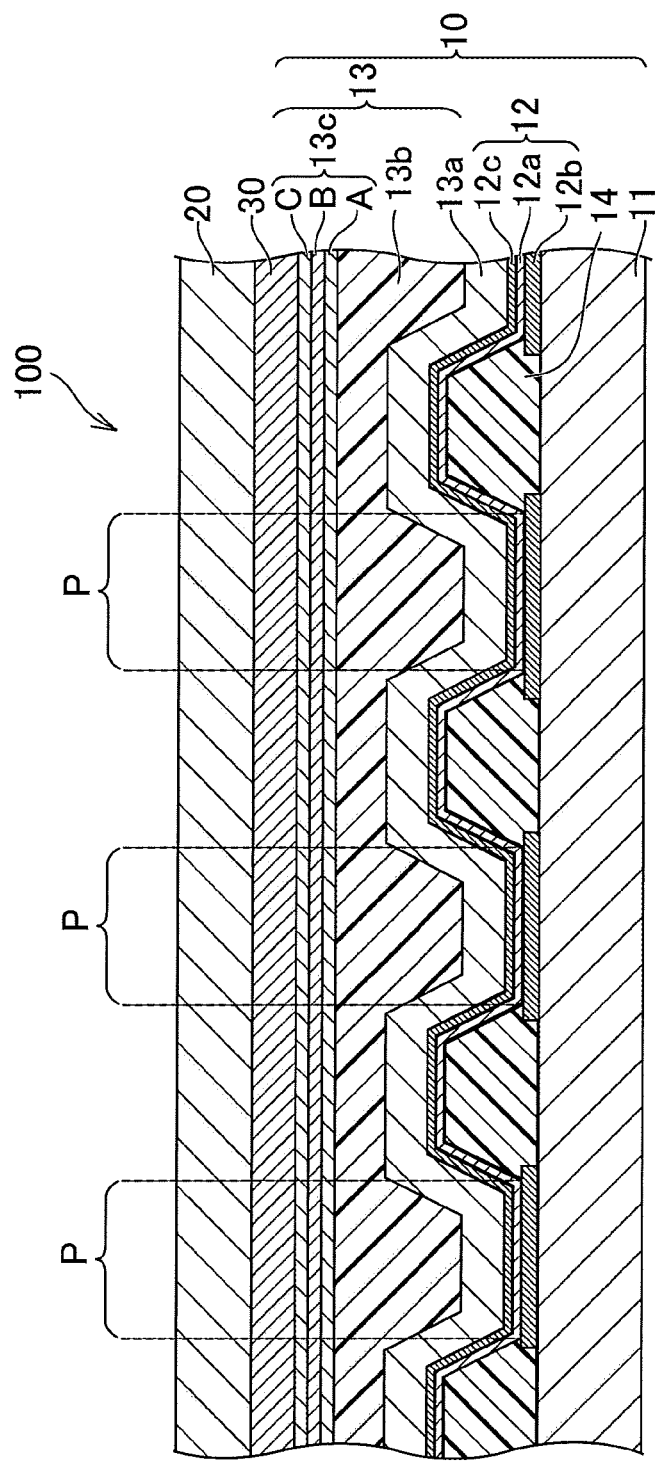
FIG. 2 is a schematic cross-sectional view schematically showing a cross-section of the display device according to the first embodiment.

First, with reference to FIGS. 1 and 2, an outline of the overall configuration of a display device according to a first embodiment will be described. FIG. 1 is an external appearance perspective view of the display device according to the first embodiment. FIG. 2 is a schematic cross-sectional view schematically showing a cross-section of the display device according to the first embodiment. In the first embodiment, a so-called organic electro-luminescence (EL) display device using organic EL is described as the display device. However, the display device is not limited to this, and it is sufficient that the display device is a display device including a layer that emits light wig a luminance controlled for each of a plurality of unit pixels constituting an image.

As shown in FIG. 1, the display device 100 includes a thin film transistor (TFT) substrate 10 including thin film transistors, and a counter substrate 20. As shown in FIG. 2, the counter substrate 20 is provided so as to face the TFT substrate 10 with a filling material 30 therebetween. Moreover, the display device 100 includes a display area M where an image is displayed, and a picture-frame area N around the display area M. A plurality of unit pixels P are provided in the display area M. Only one unit pixel P is illustrated in FIG. 1; actually, however, the plurality of unit pixels P are disposed in a matrix in the display area M.

As shown in FIG. 2, the TFT substrate 10 includes a substrate 11, a light-emitting element layer 12 provided on the substrate 11, and a sealing layer 13 provided on the light-emitting element layer 12 and including a plurality of layers. Hereinafter, the details of the layers and substrate included in the TFT substrate 10 will be described.

The substrate 11 includes at least a circuit layer including a wiring line. The details of the wiring line of the circuit layer will be described later. In terms of the flexibility of the display device, the substrate is preferably made of polyimide or the like having flexibility. However, the substrate 11 is not limited to that and may be a glass substrate or the like.

The light-emitting element layer 12 is a layer that emits light with a luminance controlled for each of the plurality of unit pixels P constituting an image. The light-emitting element layer 12 is provided at least in the display area M and includes an organic EL layer 12a, a lower electrode 12b provided below the organic EL layer 12a, and an upper electrode 12c provided on the organic EL layer 12a. The details of the organic EL layer 12a are not illustrated, but the organic EL layer 12a includes a charge transport layer, a charge injection layer, and a light-emitting layer.

An area of the organic EL layer 12a that is in contact with the lower electrode 12b corresponds to each of the unit pixels P, and light emission is performed in this area. The unit pixels P are defined by a bank layer 14. An area where the organic EL layer 12a and the lower electrode 12b are spaced apart from each other by the bank layer 14 is an area where light emission is not performed. The upper electrode 12c is disposed on the organic EL layer 12a over the plurality of unit pixels P. In the first embodiment, the lower electrode 12b is an anode while the upper electrode 12c is a cathode; however, the lower electrode 12b and the upper electrode 12c are not limited to them and may be reversed in polarity. The upper electrode 12c through which light from the organic EL layer 12a passes is preferably formed as a transmissive electrode using a transparent conductive material or the like. As the transparent conductive material, for example, indium tin oxide (ITO), indium zinc oxide (IZO), or the like is preferably used. Moreover, the upper electrode 12c may be formed as a thin film that allows light to pass therethrough using aluminum (Al), silver (Ag), or an alloy of silver and magnesium (Mg), or may be formed as a stacked film of these metal thin films and a transparent conductive material.

In the first embodiment, a separately coloring system in which the organic EL layer 12a is separately colored so as to emit lights corresponding to the respective colors of the unit pixels P may be employed, or a color filter system in which all of the unit pixels emit lights of the same color (e.g., white) and only light at a predetermined wavelength is allowed to pass in each of the unit pixels P through a color filter provided in the counter substrate 20 may be employed.

The sealing layer 13 is provided for preventing external moisture from entering the inside of the display device 100 and reaching the organic EL layer 12a. In the first embodiment as shown in FIG. 2, the sealing layer 13 is configured by stacking an inorganic layer 13a covering the light-emitting element layer 12, an organic layer 13b provided on the inorganic layer 13a, and an inorganic layer 13c provided on the organic layer 13b. In the first embodiment, the inorganic layer 13c is the uppermost layer of the sealing layer 13. The inorganic layers 13a and 13c are made of silicon nitride (SiN), but are not limited to this as long as the inorganic layers 13a and 13c are made of an inorganic material having high moisture resistance. For example, the inorganic layers 13a and 13c may be made of silicon oxide or the like. Moreover, the organic layer 13b is made of acrylic resin, but is not limited to this. The organic layer 13b may be made of epoxy resin or the like.

Figure 3:
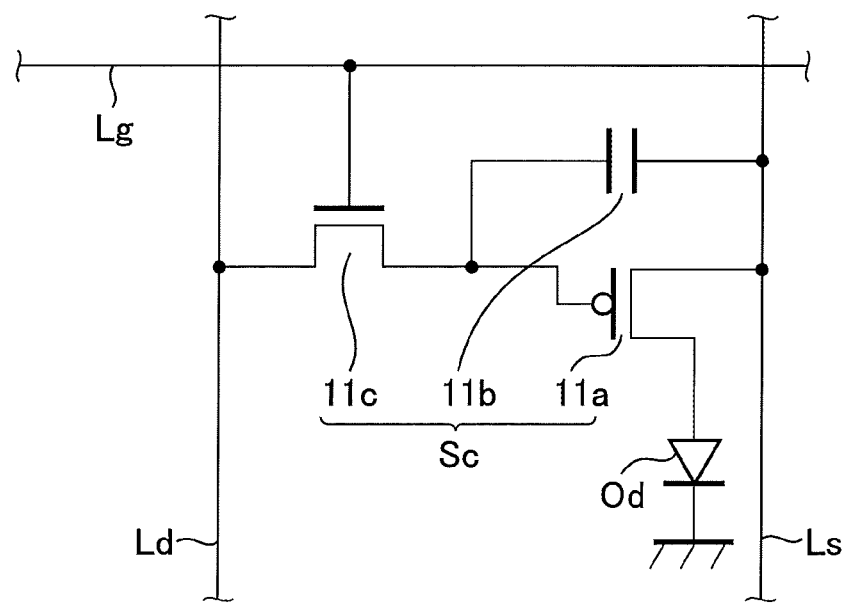
FIG. 3 is a circuit diagram showing a circuit formed for each of unit pixels.

Further, with reference to FIGS. 2 and 3, the principle of light emission of the light-emitting element layer will be described. FIG. 3 is a circuit diagram showing a circuit formed for each of the unit pixels P. The wiring line of the circuit layer included in the substrate 11 includes a scanning line Lg, a video signal line Ld orthogonal to the scanning line Lg, and a power supply line Ls orthogonal to the scanning line Lg as shown in FIG. 3. Moreover, a pixel control circuit Sc is provided for each of the unit pixels P in the circuit layer. The pixel control circuit Sc is connected to the lower electrode 12b through a contact hole (not shown). The pixel control circuit Sc includes thin film transistors and a capacitor, and controls the supply of an electric current to an organic light-emitting diode Gd provided for each of the unit pixels P. The organic light-emitting diode Gd is composed of the organic EL layer 12a, the lower electrode 12b, and the upper electrode 12c, which have been described above with reference to FIG. 2.

As shown in FIG. 3, the pixel control circuit Sc includes a driver TFT 11a, a storage capacitor 11b, and a switching TFT 11c. The gate of the switching TFT 11c is connected to the scanning line Lg, and the drain of the switching TFT 11c is connected to the video signal line Ld. The source of the switching TFT 11c is connected to the storage capacitor 11b and the gate of the driver TFT 11a. The drain of the driver TFT 11a is connected to the power supply line Ls, and the organic light-emitting diode Od is connected to the source of the driver TFT 11a. In response to application of a gate voltage to the scanning line Lg, the switching TFT 11c is brought into the ON state. At this time, when a video signal is supplied from the video signal line Ld, charge is accumulated in the storage capacitor 11b. In response to the accumulation of charge in the storage capacitor 11b, the driver TFT 11a is brought into the ON state to allow an electric current to flow from the power supply line Ls into the organic light-emitting diode Od, so that the organic light-emitting diode Cd emits light.

It is sufficient that the pixel control circuit Sc is a circuit for controlling the supply of an electric current to the organic light-emitting diode Cd, and the pixel control circuit Sc is not limited to that shown in FIG. 3. For example, the pixel control circuit Sc may further include, in addition to the storage capacitor 11b, an auxiliary capacitance for increasing capacitance, and the polarities of the transistors constituting the circuit are not limited to those shown in FIG. 3.

Next, the sealing layer 13 will be described further in detail. In recent years, while the display device is required to be flexible, the resistance of the inorganic layer included in the sealing layer 13 to bending becomes a problem. The problem is remarkable especially in the inorganic layer 13c provided at the uppermost layer of the sealing layer 13 which is likely to be subjected to stress. It is conceivable to reduce the thickness of the inorganic layer 13c for ensuring the resistance to bending. In that case, however, the sealing layer 13 fails to play its essential role of preventing the entry of external moisture.

In the first embodiment, therefore, an area having a density lower than that of the other area is partially provided in the inorganic layer 13c. Specifically, the inorganic layer 13c is configured to include a dense film C, a sparse film B provided below the dense film C and having a density lower than that of the dense film C, and a dense film A provided below the sparse film B and having a density higher than that of the sparse film B. In the first embodiment, the density of the dense film A and the density of the dense film C are equal to each other; however, it is sufficient that at least the densities thereof are high compared with the sparse film B. Moreover, in the first embodiment, the inorganic layer 13c that is composed of three films separated into the dense films and the sparse film is shown; however, the films having different densities do not need to be provided to be distinctly separated, and the inorganic layer 13c may have a configuration in which the density changes continuously or stepwise in the thickness direction.

Here, the sparse film B is formed using raw materials similar to those of the dense films A and C, but the ratio of the raw materials to be used is different. Specifically, the sparse film B contains a larger amount of hydrogen than the dense films A and C and has correspondingly less SiN bonds, thereby resulting in low density. The details of a deposition method of the sparse film B and the dense films A and C will be described later.

The sparse film B of the inorganic layer 13c, which has a density lower than that of the other area, is softer than the other area and has high resistance to bending. Moreover, the sparse film B provided in contact with the dense films A and C also plays the role of relieving bending stress applied to the dense films A and C, and thus improves the resistance of the dense films A and C to bending. Therefore, the inorganic layer 13c as a whole has high resistance to bending, compared with the case where the sparse film B is not included. On the other hand, the inorganic layer 13c includes the dense film A and the dense film C each having a density higher than that of the sparse film B and therefore easily prevents the entry of external moisture compared with the case where the density of the entire layer is lowered (the case where the density of the entire layer is made equal to that of the sparse film B). Since the dense film A and the dense film C are included, the entry of moisture can be prevented without increasing the entire thickness of the inorganic layer 13c; therefore, the entire thickness of the display device 100 can be reduced, and thus the downsizing of the device can also be realized. The sealing layer 13 including the inorganic layer 13c does not need to be provided on the entire surface of the display device 100, but may be provided in the display area M so as to cover at least the light-emitting element layer 12.

In the display device 100 according to the first embodiment as has been described above, the entry of moisture into the inside of the device can be prevented while ensuring the resistance to bending. Specifically, the resistance to bending can be ensured because the inorganic layer 13c includes the sparse film B while the entry of moisture into the inside of the device can be prevented because the inorganic layer 13c includes the dense films A and C. As a result, the organic EL layer 12a is prevented from deteriorating due to the influence of moisture, and thus a reduction in the lifetime of the device can be reduced.

In the above description, the sparse film B has been described as being a film having a low density compared with the dense film A and the dense film C. In another perspective, however, the sparse film B may be described as being a film having a low refractive index compared with the dense film A and the dense film C.

Figure 4:
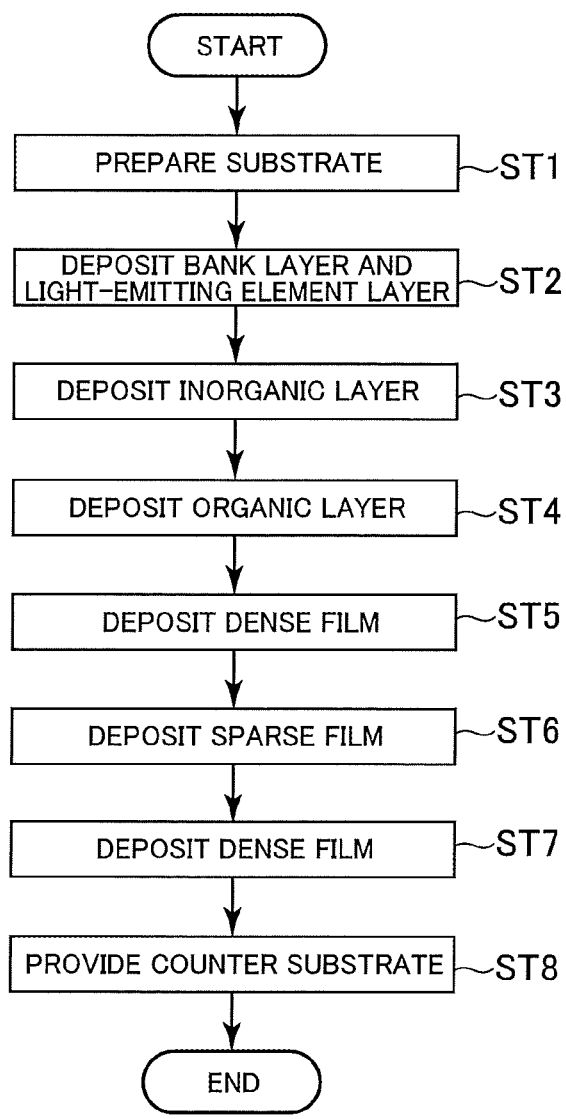
FIG. 4 is a flowchart illustrating a method for manufacturing the display device according to the first embodiment.

Further, with reference to FIG. 4, method for manufacturing the display device according to the first embodiment will be described. FIG. 4 is a flowchart illustrating the method for manufacturing the display device according to the first embodiment.

First, the substrate 11 including the circuit layer is prepared (Step ST1). Next, the bank layer 14 and the light-emitting element layer 12 are deposited on the substrate 11 (Step ST2). Further, the inorganic layer 13a made of silicon nitride is deposited on the light-emitting element layer 12 using a material containing silicon, ammonia gas, and nitrogen gas as components by a chemical vapor deposition method (hereinafter referred to as "CVD method") (Step ST3). As the CVD method, a plasma CVD method in which source gas is converted into plasma to cause chemical reaction may be employed. In this step, nitrogen gas is used for adjusting the amount of pressure, and silicon nitride is generated by reaction of silicon and ammonia gas. The inorganic layer 13a is formed in a shape conforming to the shape of the light-emitting element layer 12. Further, the organic layer 13b made of acrylic resin is deposited on the inorganic layer 13a (Step ST4). The surface of the organic layer 13b made of a resin material has a flat shape. Next, the inorganic layer 13c made of silicon nitride, which is the uppermost layer of the sealing layer 13, is deposited on the organic layer 13b having the flat surface.

Here, the details of the deposition method of the inorganic layer 13c will be described. The inorganic layer 13c is formed using a material containing silicon, ammonia gas, and nitrogen gas as components by the CVD method, similarly to the inorganic layer 13a. First, the dense film A is deposited on the organic layer 13b by the CVD method (Step ST5). The deposition of the dense film A is performed using the raw materials at the same ratio as that of the inorganic layer 13a by a step similar thereto. Then, the sparse film B is deposited on the dense film A by the CVD method (Step ST6). On this occasion, the ratio of hydrogen gas is increased by increasing the ratio of ammonia gas for making the density of the sparse film B lowering than that of the dense film A. Since the hydrogen gas remains inside the layer, the number of SiN bonds inside the inorganic layer 13c decreases as the ratio of hydrogen gas increases. As a result, the density of the inorganic layer 13c is lowered. With this configuration, the sparse film B having a density lower than that of the dense film A is deposited. Further, the dense film C is deposited on the sparse film B using the raw materials at the same ratio as that of the dense film A by a step similar thereto (Step ST7). Through the steps described above, the manufacture of the TFT substrate 10 is completed. As has been described above, the deposition of the dense films A and C and the deposition of the sparse film B are performed using the same raw materials, but the ratio of the raw materials is varied to provide a difference in density.

The method for forming the sparse film B having a low density is not limited to that of increasing the ratio of ammonia gas, but may be performed by adding a step of separately adding hydrogen gas during deposition. That is, other methods may be used as long as the ratio of hydrogen gas in the inorganic layer 13c can be increased. The substance to be added is not limited to hydrogen gas, but other substances may be used as long as the substance remains inside the inorganic layer 13c and is less likely to affect the organic EL layer 12a. Moreover, the deposition of the inorganic layers 13a and 13c is not limited to the CVD method, but other methods such as a sputtering method or an atomic layer deposition (ALD) method may be used.

After the completion of Step ST7, the counter substrate 20 is provided so as to face the TFT substrate 10 with the filling material 30 therebetween. Through the steps described above, the manufacture of the display device 100 according to the first embodiment is completed.

Next, with reference to FIG. 5, a display device 200 according to a second embodiment will be described. The display device 200 according to the second embodiment has a configuration similar to that of the display device 100, except that the stacked structure of the inorganic layer 13a is different. In the display device 200, the stacked structure of the inorganic layer 13a is similar to the stacked structure of the inorganic layer 13c. The external appearance of the display device 200 is similar to that of the display device 100 described with reference to FIG. 1, and the principle of light emission of the display device 200 is also similar to that of the display device 100. The same applies to display devices 300, 400, and 500 described later. Only the configuration different from that of the display device 100 is described below, and a description of the common configurations is omitted.

Figure 5:
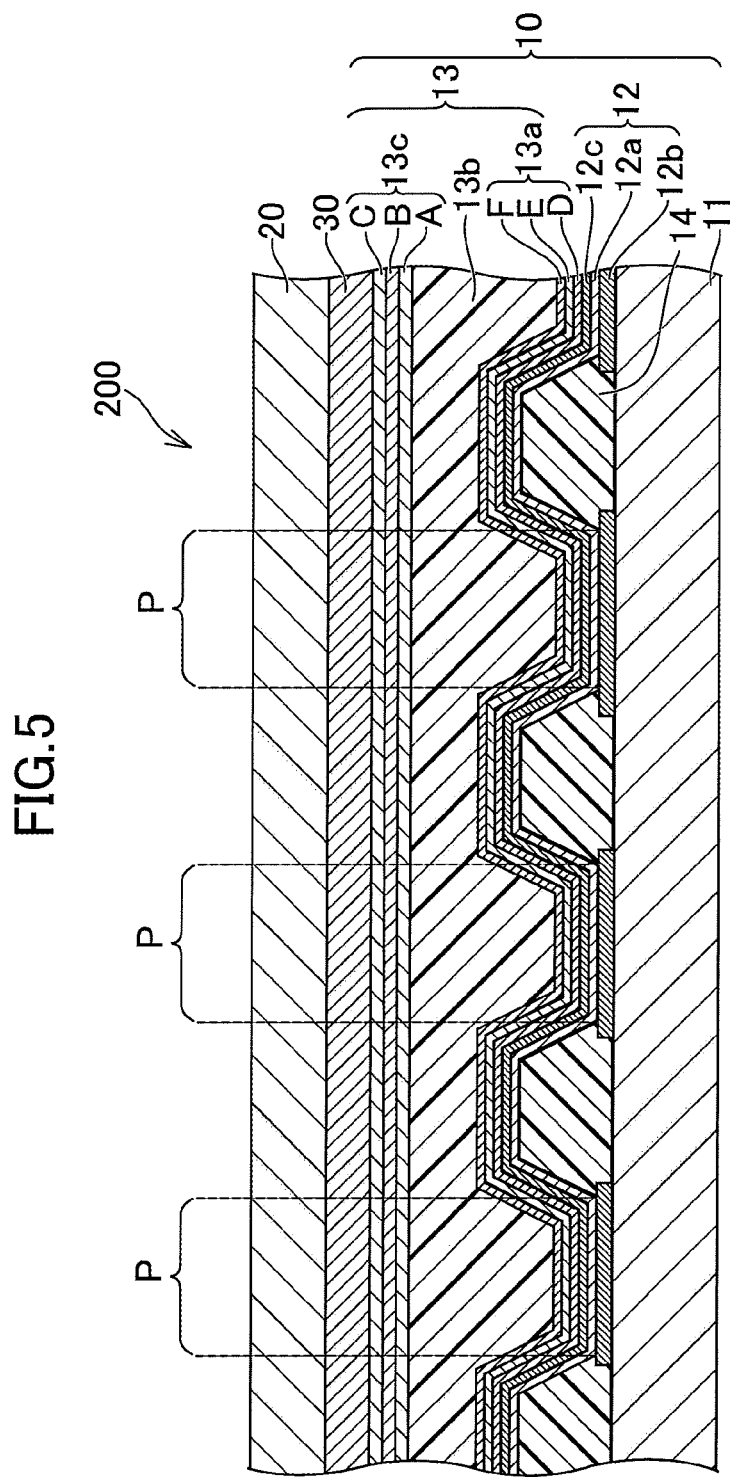
FIG. 5 is a schematic cross-sectional view schematically showing a cross-section of a display device according to a second embodiment.

In the second embodiment as shown in FIG. 5, the inorganic layer is configured by stacking a dense film D provided on the light-emitting element layer 12, a sparse film E provided on the dense film D and having a density lower than that of the dense film D, and a dense film F provided on the sparse film E and having a density higher than that of the sparse film E. The sparse film E contains a larger amount of hydrogen gas than the dense films D and F. The dense films D and F are deposited using the raw materials at the same ratio as that of the dense films A and C by a step similar thereto; while the sparse film E is deposited using the raw materials at the same ratio as that of the sparse film B by a step similar thereto. The inorganic layer 13a is provided on the light-emitting element layer 12 and therefore has a shape conforming to the shape of the upper electrode 12c.

In the second embodiment as has been described above, the area having a density lower than that of the other area is provided, not only in the inorganic layer 13c which is the uppermost layer of the sealing layer 13, but also in the inorganic layer 13a. Therefore, the resistance to bending can be further increased. In the second embodiment, the inorganic layer 13a composed of three films separated into the dense films and the sparse film is shown; however, the films having different densities do not need to be provided to be distinctly separated, and the inorganic layer 13a may have a configuration in which the density changes continuously or stepwise in the thickness direction.

Next, with reference to FIG. 6, the display device 300 according to a third embodiment will be described. The display device 300 according to the third embodiment has a configuration similar to that of the display device 100, except that the stacked structure of the inorganic layer 13c is different. Only the configuration different from that of the display device 100 is described below, and a description of the common configurations is omitted.

Figure 6:
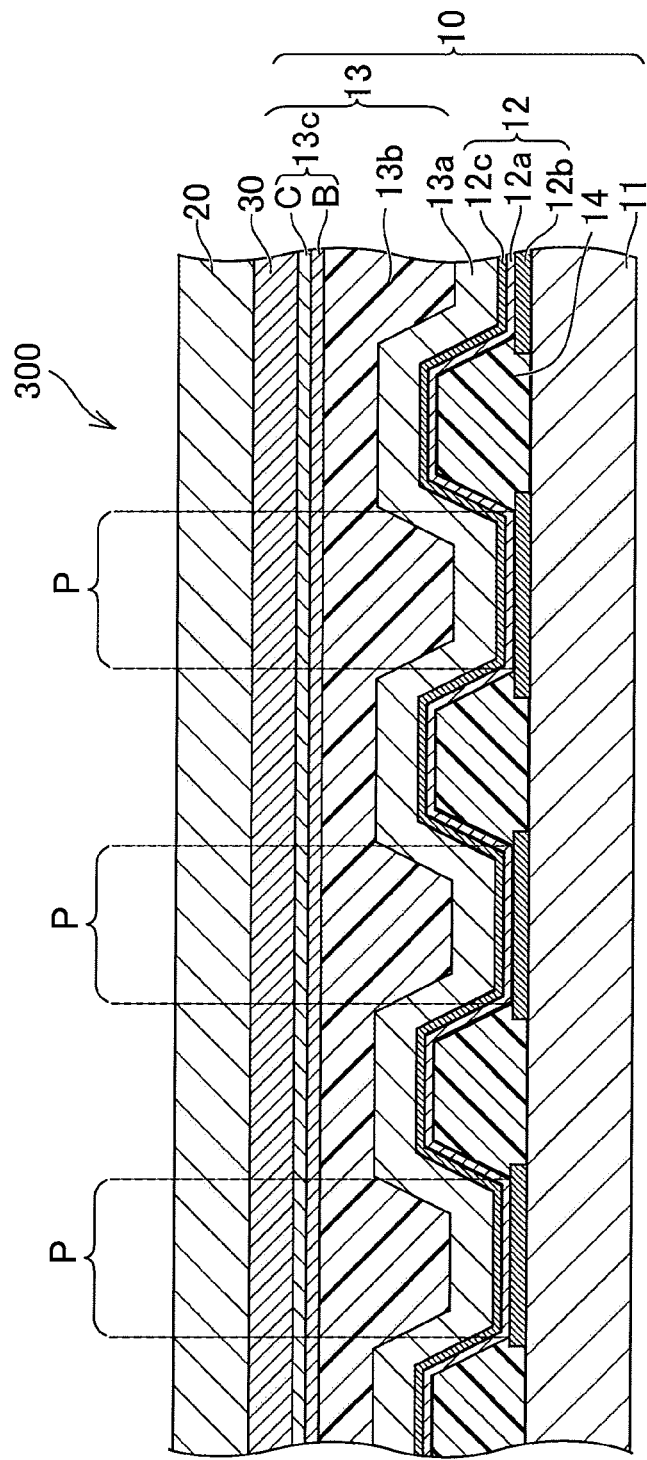
FIG. 6 is a schematic cross-sectional view schematically showing a cross-section of a display device according to a third embodiment.

In the third embodiment as shown in FIG. 6, the inorganic layer 13c, which is the uppermost layer of the sealing layer 13, includes the sparse film B provided on the organic layer 13b and the dense film C provided on the sparse film B and having a density higher than that of the sparse film B. That is, with respect to the inorganic layer 13c, the display device 300 employs a configuration including two films of, from above, the dense film C and the sparse film B stacked on each other, unlike the display device 100 including three films of, from above, the dense film C, the sparse film B, and the dense film A stacked on one another.

The inorganic layer 13c, which is the uppermost layer, is not limited to that composed of two films separated into the dense film and the sparse film, but may have a configuration in which the density changes continuously or stepwise in the thickness direction. For example, the inorganic layer 13c may be a layer whose density gradually decreases toward the light-emitting element layer 12 side in the thickness direction.

In the third embodiment, a configuration in which the film at the uppermost layer of the inorganic layer 13c is the dense film C and the sparse film B is provided below the dense film is employed; however, a configuration in which the film at the uppermost layer of the inorganic layer 13c is the sparse film B and the dense film C is provided below the sparse film B may be employed. While the uppermost layer is more likely to be subjected to stress, the resistance to bending can be increased by providing the sparse film B at the uppermost layer.

The configuration in which the inorganic layer 13c is composed of two films of the dense film C and the sparse film B may be applied to the inorganic layer 13a. That is, the inorganic layer 13a may have a configuration including a sparse film formed on the light-emitting element layer 12 and a dense film formed on the sparse film and having a density higher than that of the sparse film.

Next, with reference to FIG. 7, the display device 400 according to a fourth embodiment will be described. The display device 400 according to the fourth embodiment has a configuration similar to that of the display device 100, except that an organic layer and an inorganic layer are further provided between the organic layer 13b and the inorganic layer 13c in the sealing layer 13. Specifically, in the fourth embodiment, layer having, not the three-layer structure in which the inorganic layer 13a, the organic layer 13b, and the inorganic layer 13c are stacked in sequence from the lower layer as shown in the first embodiment, but a five-layer structure in which the inorganic layer 13a, the organic layer 13b, an inorganic layer 13d, an organic layer 13e, and the inorganic layer 13c are stacked in sequence from the lower laver, is employed as the sealing layer 13. Only the configuration different from that of the display device 100 is described below, and a description of the common configurations is omitted.

The inorganic layer 13d has a stacked structure similar to that of the inorganic layer 13c of the display device 100. That is, the inorganic layer 13d includes the dense film A, the sparse film B provided on the dense film A and having a density lower than that of the dense film A, and the dense film C having a density higher than that of the sparse film B.

Since the stacked structure of the five-layer structure is employed in the display device 400 as described above, it can be said that the display device 400 has a configuration that easily prevents the entry of moisture into the inside of the device compared with the display device 100 employing the three-layer structure. Moreover, since the inorganic layer 13d includes the sparse film B having a density lower than that of the other area, the resistance of the entire sealing layer 13 to bending can be correspondingly ensured.

The inorganic layer 13a shown in each of the first to fourth embodiments corresponds to a first inorganic layer of the disclosure; the organic layer 13b corresponds to an organic layer of the disclosure; the inorganic layer 13c corresponds to a second inorganic layer that is an uppermost layer of the disclosure; the dense film C corresponds to a first dense film of the disclosure; and the sparse film B corresponds to a first sparse film of the disclosure. Moreover, the dense film A included in the inorganic layer 13c shown in each of the first, second and fourth embodiments corresponds to a second dense film of the disclosure. Moreover, the dense film F included in the inorganic layer 13a shown in the second embodiment corresponds to a third dense film of the disclosure, and the sparse film E corresponds to a second sparse film of the disclosure. While there have been described what are at present considered to be certain embodiments of the disclosure, it will be understood that various modifications may be made thereto, and it is intended that the appended claims cover all such modifications as fall within the true spirit and scope of the disclosure.

The invention claimed is:

1. A semiconductor device comprising:
a diode element including a first electrode, a second electrode, and a semiconductor layer between the first electrode and the second electrode; and
an insulating layer on the diode element, the insulating layer including a first inorganic layer, and an organic layer on the first inorganic layer, wherein
the first inorganic layer includes a lower surface in contact with the diode element,
the first inorganic layer includes a first region which includes the lower surface, and a second region which is between the first region and the organic layer, and
a density of the first inorganic layer in the first region is higher than that in the second region.

2. The semiconductor device according to claim 1, wherein
the first inorganic layer includes a third region between the second region and the organic layer, and
a density of the first inorganic layer in the third region is higher than that in the second region.

3. The semiconductor device according to claim 2, wherein
the density of the first inorganic layer between the second region and the third region changes continuously such that the density increases toward the third region.

4. The semiconductor device according to claim 2, wherein
the density of the first inorganic layer between the second region and the third region changes stepwise such that the density increases toward the third region.

5. The semiconductor device according to claim 1, wherein
the second region contains a larger amount of hydrogen than the first region.

6. The semiconductor device according to claim 1, wherein
the density of the first inorganic layer between the first region and the second region changes continuously such that the density decreases toward the second region.

7. The semiconductor device according to claim 1, wherein
the density of the first inorganic layer between the first region and the second region changes stepwise such that the density decreases toward the second region.

8. The semiconductor device according to claim 1, the insulating layer further comprises a second inorganic layer on the first organic layer, wherein
the second inorganic layer includes an upper surface opposite to the organic layer,
the second inorganic layer includes a fourth region which includes the upper surface, and a fifth region which is between the fourth region and the organic layer, and
a density of the second inorganic layer in the fourth region is higher than that in the fifth region.

9. The semiconductor device according to claim 8, wherein
the second inorganic layer includes a sixth region between the fifth region and the organic layer, and
a density of the second inorganic layer in the sixth region is higher than that in the fifth region.

10. The semiconductor device according to claim 9, wherein
the density of the second inorganic layer between the fifth region and the sixth region changes continuously such that the density increases toward the sixth region.

11. The semiconductor device according to claim 9, wherein
the density of the second inorganic layer between the fifth region and the sixth region changes stepwise such that the density increases toward the sixth region.

12. The semiconductor device according to claim 8, wherein
the fifth region contains a larger amount of hydrogen than the fourth region.

13. The semiconductor device according to claim 8, wherein
the density of the second inorganic layer between the fourth region and the fifth region changes continuously such that the density decreases toward the fifth region.

14. The semiconductor device according to claim 8, wherein
the density of the second inorganic layer between the fourth region and the fifth region changes stepwise such that the density decreases toward the fifth region.

* * * * *